United States Patent [19]
Kim

[11] Patent Number: 6,026,035
[45] Date of Patent: Feb. 15, 2000

[54] INTEGRATED CIRCUIT MEMORY DEVICES HAVING IMPROVED PRECHARGE AND I/O DRIVER CHARACTERISTICS AND METHODS OF OPERATING SAME

[75] Inventor: Gyu-hong Kim, Seoul, Rep. of Korea

[73] Assignee: Samsung Electronics Co., Ltd., Rep. of Korea

[21] Appl. No.: 09/226,224

[22] Filed: Jan. 7, 1999

[30] Foreign Application Priority Data

Feb. 28, 1998 [KR] Rep. of Korea ......................... 98/6611

[51] Int. Cl.[7] ....................................................... G11C 7/00
[52] U.S. Cl. ............................................. 365/190; 365/203
[58] Field of Search ................................. 365/203, 190, 365/189.11, 189.05

[56] References Cited

U.S. PATENT DOCUMENTS

| | | | |
|---|---|---|---|
| 5,659,512 | 8/1997 | Koyanagi et al. | 365/190 |
| 5,777,935 | 7/1998 | Pantelakis et al. | 365/203 |
| 5,875,140 | 2/1999 | Merritt et al. | 365/203 |

*Primary Examiner*—Tan T. Nguyen
*Attorney, Agent, or Firm*—Myers Bigel Sibley & Sajovec

[57] ABSTRACT

Integrated circuit memory devices include a pair of complementary input/output lines (IO and /IO), a pair of complementary data lines (DATA and /DATA) and a driver circuit which is responsive to a driver signal (PDT) and drives the pair of complementary input/output lines with complementary data from the pair of complementary data lines when the driver signal is in an enabled state (e.g., logic 1). A precharge circuit is also provided. This precharge circuit, which is responsive to a precharge control signal (PIOPR) and the driver signal (PDT), precharges the pair of complementary input/output lines IO and /IO during a precharge time interval which precedes the generation of a column select signal (CSL). The precharge time interval commences when the driver signal (PDT) and the precharge control signal (PIOPR) are in disabled and enabled states, respectively, at the same time. The precharge time interval also terminates upon transition of the driver signal (PDT) from its disabled state to an enabled state, even if the precharge control signal remains in its enabled state.

19 Claims, 5 Drawing Sheets

INTEGRATED CIRCUIT MEMORY DEVICES HAVING IMPROVED PRECHARGE AND I/O DRIVER CHARACTERISTICS AND METHODS OF OPERATING SAME

RELATED APPLICATION

This application is related to Korean Application No. 98-6611, filed Feb. 28, 1998, the disclosure of which is hereby incorporated herein by reference.

FIELD OF THE INVENTION

The present invention relates to integrated circuit devices, and more particularly to integrated circuit memory devices and methods of operating integrated circuit memory devices.

BACKGROUND OF THE INVENTION

State-of-the-art personal computers and multimedia devices typically require high speed integrated circuit memory devices to operate efficiently. High speed integrated circuit memory devices now include a family of merged memory/logic (MML) devices. As will be understood by those skilled in the art, such devices include high speed logic and memory circuits on a single integrated circuit chip. Techniques for increasing the speed of memory devices typically include techniques for increasing the speed of writing and reading operations.

Referring now to FIG. 1, a conventional integrated circuit memory device is illustrated. This memory device includes a memory cell 101, a bit line sense amplifier 103 and a column select circuit 105. The memory cell 101 may include an access transistor which has a gate electrode electrically connected to a word line WL. Data can be written to a pair of memory cells or read from a pair of memory cells via a pair of complementary bit lines BL and /BL. Data can also be passed to or from a pair of complementary input/output lines via the column select circuit 105 by applying a logic 1 column select signal (CSL) thereto to turn on the pass transistors therein.

Complementary write data can be provided to the input/output lines IO and /IO by a data input buffer 109 and an I/O driver and precharge circuit 107. The I/O driver and precharge circuit 107 is responsive to a precharge signal PIOPR and a driver signal PDT. In particular, when the precharge signal PIOPR is set to a logic 1 potential, the complementary input/output lines IO and /IO are equalized at a desired potential (e.g., Vdd or Vdd/2), however, when the driver signal PDT is set to a logic 1 potential, data is passed from the data-in port (Din) to the input/output lines IO and /IO. During a reading operation, data can be provided to a data-out port (Dout) via an I/O sense amplifier 111 and data output buffer 113.

Referring now to FIG. 2, performance of a read operation on the memory device of FIG. 1 may include the steps of generating a logic 1 write enable signal (WEB) and a logic 0 column address strobe (CASB) pulse at a leading edge of a clock signal (CLK). Then, prior to generation of a logic 1 column select signal (CSL), the precharge signal PIOPR can be generated at a logic 1 potential to cause the input/output lines IO and /IO to be precharged. After the input/output lines have been sufficiently precharged, the precharge signal PIOPR is reset to a logic 0 potential and the column select signal CSL is set to a logic 1 potential (enabled). After the column select signal CSL has been enabled, data from a pair of complementary memory cells is passed from the complementary bit lines BL and /BL to the input/output lines IO and /IO, as illustrated.

Next, the performance of a write operation may include the steps of generating a logic 0 write enable (WEB) pulse and a logic 0 column address strobe (CASB) pulse at the leading edge of the clock signal CLK. Then, while the column select signal CSL is maintained at a logic 0 potential, the precharge signal PIOPR is set to a logic 1 potential to precharge the input/output lines IO and /IO. Next, the driver signal PDT and column select signal CSL are simultaneously set to a logic 1 potentials so that input data can be passed from the driver circuit 107 to the complementary bit lines BL and /BL (via the input/output lines IO and /IO and the column select circuit 105). Unfortunately, these operations may cause an unnecessarily large loading capacitance to be applied to the IO driver and precharge circuit 107 and can also increase the minimum time (as measured by "tw") needed before valid data becomes available on the complementary bit lines BL and /BL.

Thus, notwithstanding the above described integrated circuit memory devices, there continues to be a need for improved integrated circuit memory devices.

SUMMARY OF THE INVENTION

It is therefore an object of the present invention to provide improved integrated circuit memory devices and methods of operating same.

It is another object of the present invention to provide integrated circuit memory devices having improved input/output line precharge capability and methods of operating same.

It is still a further object of the present invention to provide integrated circuit memory devices with reduced write cycle time and methods of operating same.

These and other objects, advantages and features of the present invention are provided by integrated circuit memory devices which comprise a pair of complementary input/output (I/O) lines, a pair of complementary data lines (DATA and /DATA) and a driver circuit which is responsive to a driver signal (PDT) and drives the pair of complementary input/output lines with complementary data from the pair of complementary data lines when the driver signal is in an enabled state (e.g., logic 1). A precharge circuit is also provided. This precharge circuit, which is responsive to a precharge control signal (PIOPR) and the driver signal (PDT), precharges the pair of complementary input/output lines during a precharge time interval which precedes the generation of a column select signal (CSL). In particular, the precharge time interval commences when the driver signal (PDT) and the precharge control signal (PIOPR) are in disabled and enabled states, respectively, at the same time. The precharge time interval also terminates upon transition of the driver signal (PDT) from its disabled state to an enabled state, even if the precharge control signal remains in its enabled state.

According to one embodiment of the present invention, the precharge circuit preferably comprises an equalization circuit which is electrically coupled to the pair of complementary input/output lines and is responsive to a pair of complementary precharge timing signals (S and /S). The precharge circuit also preferably comprises a precharge timing circuit which generates the pair of complementary precharge timing signals S and /S in response to the precharge control signal PIOPR and the driver signal PDT. Here, the equalization circuit may comprise first and second NMOS transistors which are electrically coupled in series (i.e., source-to-drain) between the pair of complementary input/output lines, and a PMOS transistor which is electrically coupled across the pair of complementary input/output lines. The first and second NMOS transistors are responsive to a first one of the pair of complementary precharge timing signals (e.g., S) and the PMOS transistor is responsive to a second one of the pair of complementary precharge timing signals (e.g., /S). The precharge timing circuit may comprise a NOR gate having a first input which is responsive to the driver signal (PDT), a second input which is responsive to an inverted version of the precharge control signal (/PIOPR) and an output which generates the first one of the pair of complementary precharge timing signals (e.g., S). The second one of the pair of complementary precharge timing signals (e.g., /S) may also be generated by an inverter which has an input electrically connected to an output of the NOR gate.

According to another preferred aspect of the present invention, the driver circuit comprises a first buffer having first and second inputs, and an output electrically connected to a first one of the pair of complementary input/output lines, a first NOR circuit having a first input responsive to a data signal (DATA), a second input responsive to an inverted version of the driver signal (/PDT) and an output electrically connected to the first input of the first buffer, and a first OR circuit having a first input which is responsive to a complementary data signal (/DATA), a second input which is responsive to the inverted version of the driver signal (/PDT) and an output which is electrically connected to the second input of the first buffer. The driver circuit also preferably comprises a second buffer having first and second inputs, and an output electrically connected to a second one of the pair of complementary input/output lines, a second NOR circuit having a first input which is responsive to the complementary data signal (/DATA), a second input which is responsive to the inverted version of the driver signal (/PDT) and an output which is electrically connected to the first input of the second buffer, and a second OR circuit which has a first input responsive to the data signal (DATA), a second input responsive to the inverted version of the driver signal and an output electrically connected to the second input of the second buffer.

A preferred method of operating an integrated circuit memory device also preferably comprises the steps of generating an enabled column select signal and an enabled precharge control signal during respective nonoverlapping time intervals, driving a pair of complementary input/output lines with write data in response to a driver signal which is enabled during a portion of a write time interval when the precharge control signal is also enabled, and precharging the complementary input/output lines during another portion of the write time interval when the precharge control signal is enabled and the driver signal is disabled.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 3:
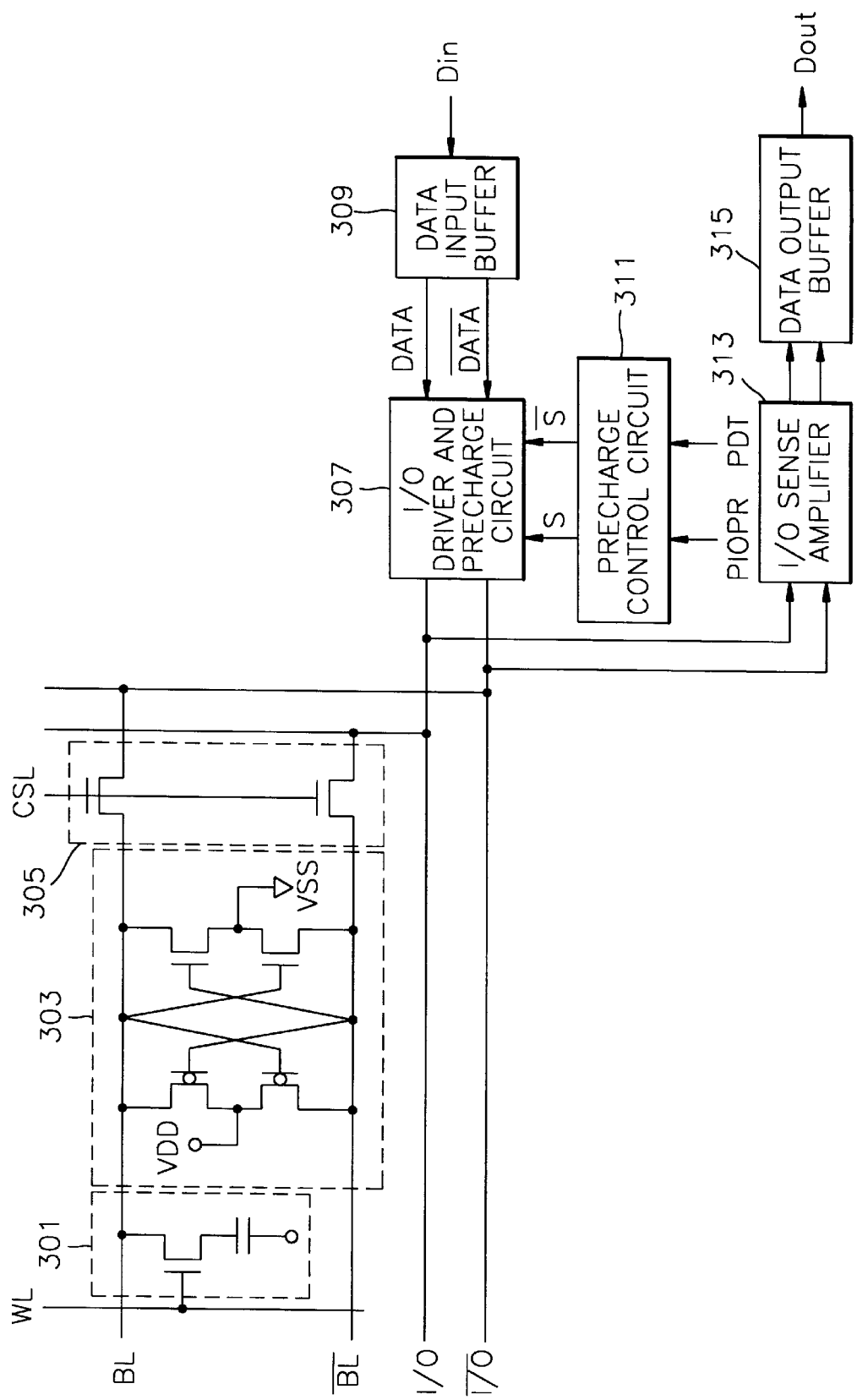
FIG. 3 is an electrical schematic of an integrated circuit memory device according to a preferred embodiment of the present invention.

Referring now to FIG. 3, an integrated circuit memory device according to an embodiment of the present invention will be described. In particular, the preferred memory device includes an array of memory cells 301 (e.g., DRAM cells) which may be connected to the true and complementary bit lines (BL and /BL) and respective word lines WL. A bit line sense amplifier 303 is also provided, as illustrated, along with a column select circuit 305 which is illustrated as containing a plurality of NMOS pass transistors. The column select circuit 305 is responsive to a column select signal line (CSL). In particular, the application of a logic 1 column select signal will electrically connect a pair of complementary input/output lines IO and /IO to a pair of complementary bit lines BL and /BL. These components of the present invention are more fully described in commonly assigned U.S. Pat. No. 5,701,268 to Lee et al. entitled "Sense Amplifier For Integrated Circuit Memory Devices Having Boosted Sense and Current Drive Capability and Methods of Operating Same", the disclosure of which is hereby incorporated herein by reference.

A pair of complementary data lines (DATA and /DATA) are also provided and these data lines receive data from a data input buffer 309 which is electrically connected to a data-in (Din) port. An I/O driver and precharge circuit 307 is also provided in combination with a precharge control circuit 311. As illustrated best by FIG. 4, the circuits which perform the precharging function include an equalization circuit 401 and a precharge timing circuit 311 and the circuit which performs the I/O driving function is denoted by reference numeral 403.

Thus, the illustrated embodiment includes a driver circuit 403 which receives complementary data and is responsive to a driver signal (PDT). As described more fully hereinbelow, this driver circuit 403 drives the pair of complementary input/output lines (IO and /IO) with complementary data from the pair of complementary data lines (DATA and /DATA) when the driver signal is in an enabled state (e.g., logic 1). The preferred precharge circuit, which is responsive to a precharge control signal (PIOPR) and the driver signal (PDT), precharges the pair of complementary input/output lines IO and /IO during a precharge time interval which, as described more fully hereinbelow with respect to FIG. 5, precedes the generation of a column select signal (CSL) so that the efficiency of a writing operation can be improved. In the output path, an I/O sense amplifier 313 is provided having inputs connected to the complementary input/output lines IO and /IO and outputs connected to a data output buffer 315 which is connected to a data-out (Dout) port.

Figure 4:
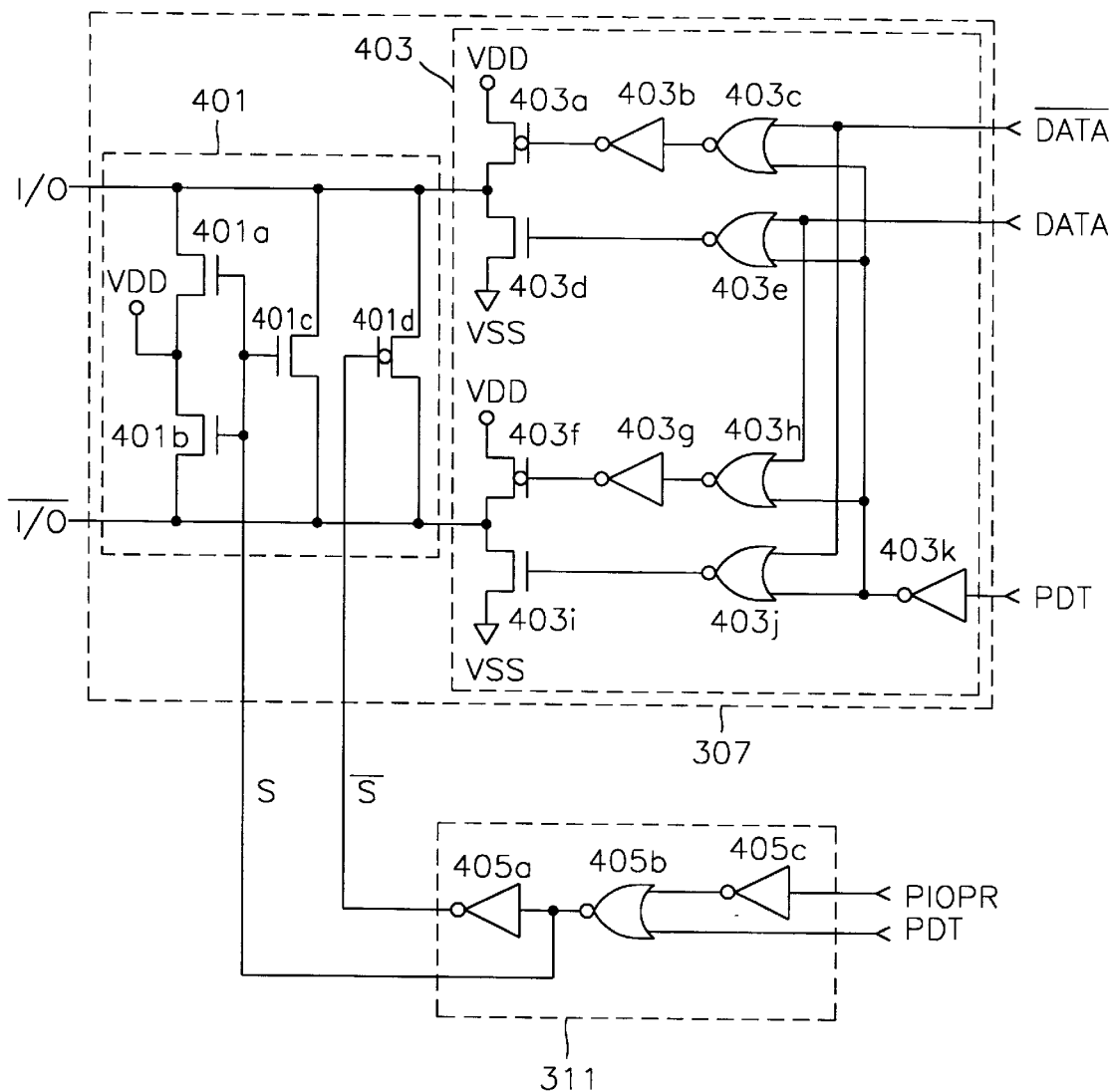
FIG. 4 is an electrical schematic of the I/O driver and precharge circuit and precharge control circuit of FIG. 3, according to a preferred aspect of the present invention.

Referring now specifically to FIG. 4, the precharge circuit preferably comprises an equalization circuit 401 which is electrically coupled to the pair of complementary input/output lines (IO and /IO). This equalization circuit 401 is responsive to a pair of complementary precharge timing signals (S and /S). The precharge circuit also preferably comprises a precharge timing circuit 311 which generates the pair of complementary precharge timing signals (S and /S) in response to the precharge control signal (PIOPR) and the driver signal (PDT). As illustrated, the equalization circuit 401 may comprise first and second NMOS transistors 401a and 401b which are electrically coupled in series (i.e., source-to-drain) between the pair of complementary input/output lines IO and /IO, and a PMOS transistor 401d which is electrically coupled across the pair of complementary input/output lines IO and /IO. A third NMOS transistor 401c may also be provided which is also electrically coupled across the pair of complementary input/output lines. The first, second and third NMOS transistors 401a and 401b are responsive to a first one of the pair of complementary precharge timing signals (S) and the PMOS transistor 401d is responsive to a second one of the pair of complementary precharge timing signals (/S). The precharge control circuit 311 may comprise a NOR gate 405b having a first input which is responsive to the driver signal (PDT), a second input which is responsive to an inverted version of the precharge control signal (/PIOPR) (provided by an inverter 405c) and an output which generates the first one of the pair of complementary precharge timing signals (S). The second one of the pair of complementary precharge timing signals (/S) may also be generated by an inverter 405a which has an input electrically connected to an output of the NOR gate 405b. Based on this configuration, the equalization circuit 401 will only be active to perform an equalization function (by pulling both IO and /IO to Vdd) when the driver signal PDT is in a disabled state (e.g., logic 0) and the precharge control signal PIOPR is in an enabled state (e.g., logic 1). Otherwise, the equalization circuit 401 will be inactive.

Referring still to FIG. 4, the driver circuit 403 comprises (i) a first buffer (NMOS transistor 403d and PMOS transistor 403a) having first and second inputs, and an output electrically connected to a first one of the pair of complementary input/output lines (e.g., IO), (ii) a first NOR circuit 403e having a first input responsive to a data signal (DATA), a second input responsive to an inverted version of the driver signal (/PDT) and an output electrically connected to the first input of the first buffer (i.e., gate electrode of NMOS transistor 403d), and (iii) a first OR circuit (NOR gate 403c and inverter 403b) having a first input which is responsive to a complementary data signal (/DATA), a second input which is responsive to the inverted version of the driver signal (/PDT) and an output which is electrically connected to the second input of the first buffer (i.e., gate electrode of PMOS transistor 403a). The driver circuit also preferably comprises (i) a second buffer (NMOS transistor 403i and PMOS transistor 403f) having first and second inputs, and an output electrically connected to a second one of the pair of complementary input/output lines (e.g., /IO), (ii) a second NOR circuit 403j having a first input which is responsive to the complementary data signal (/DATA), a second input which is responsive to the inverted version of the driver signal (/PDT) and an output which is electrically connected to the first input of the second buffer (i.e., gate electrode of NMOS transistor 403i), and (iii) a second OR circuit (NOR gate 403h and inverter 403g) which has a first input responsive to the data signal (DATA), a second input responsive to the inverted version of the driver signal (/PDT) and an output electrically connected to the second input of the second buffer (i.e., gate electrode of PMOS transistor 403f). Based on this configuration of the driver circuit 403, the complementary data signals DATA and /DATA will be passed to the input/output signal lines IO and /IO whenever the driver signal is set to a logic 1 potential.

Figure 1:
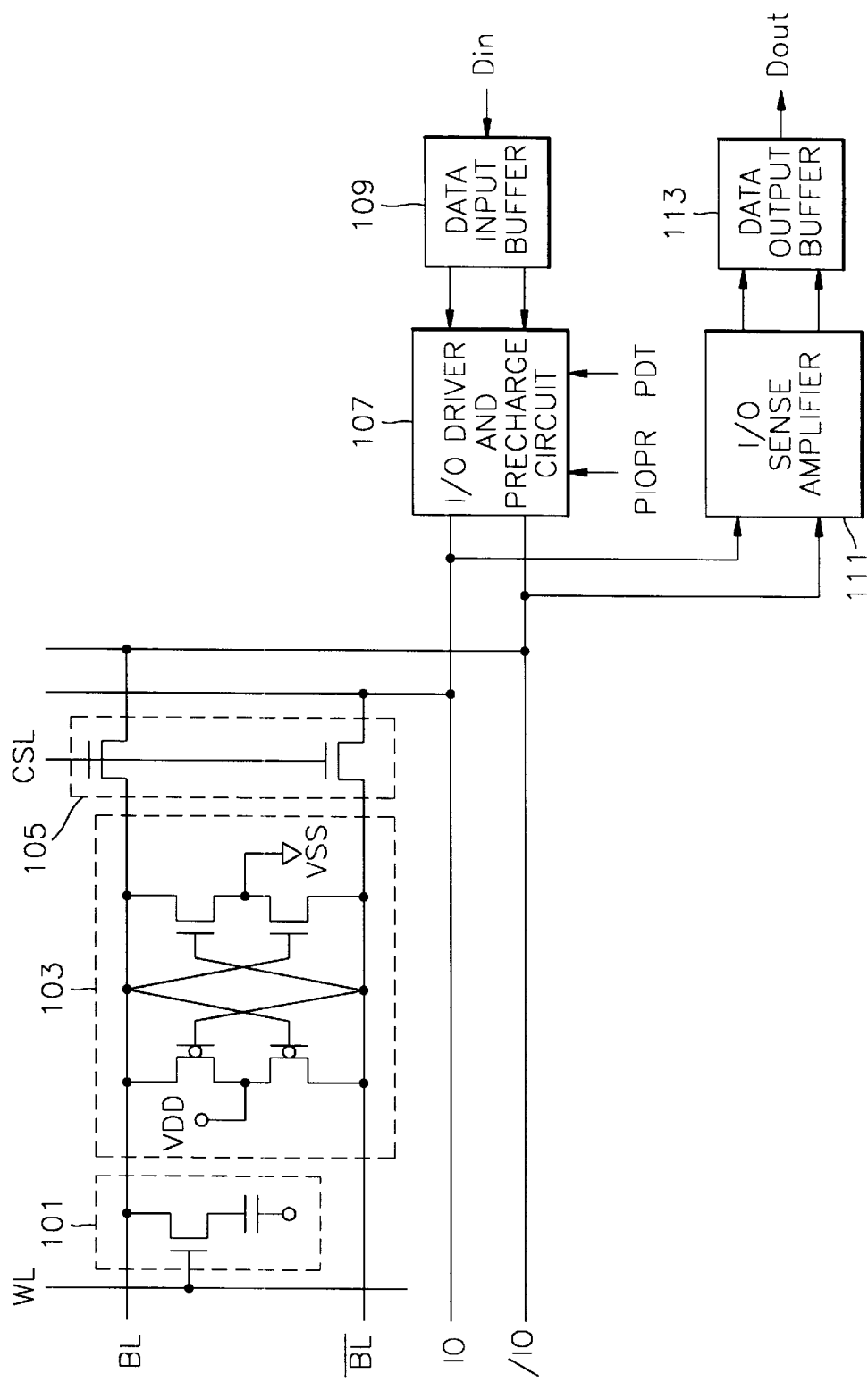
FIG. 1 is an electrical schematic of an integrated circuit memory device according to the prior art.
Figure 2:
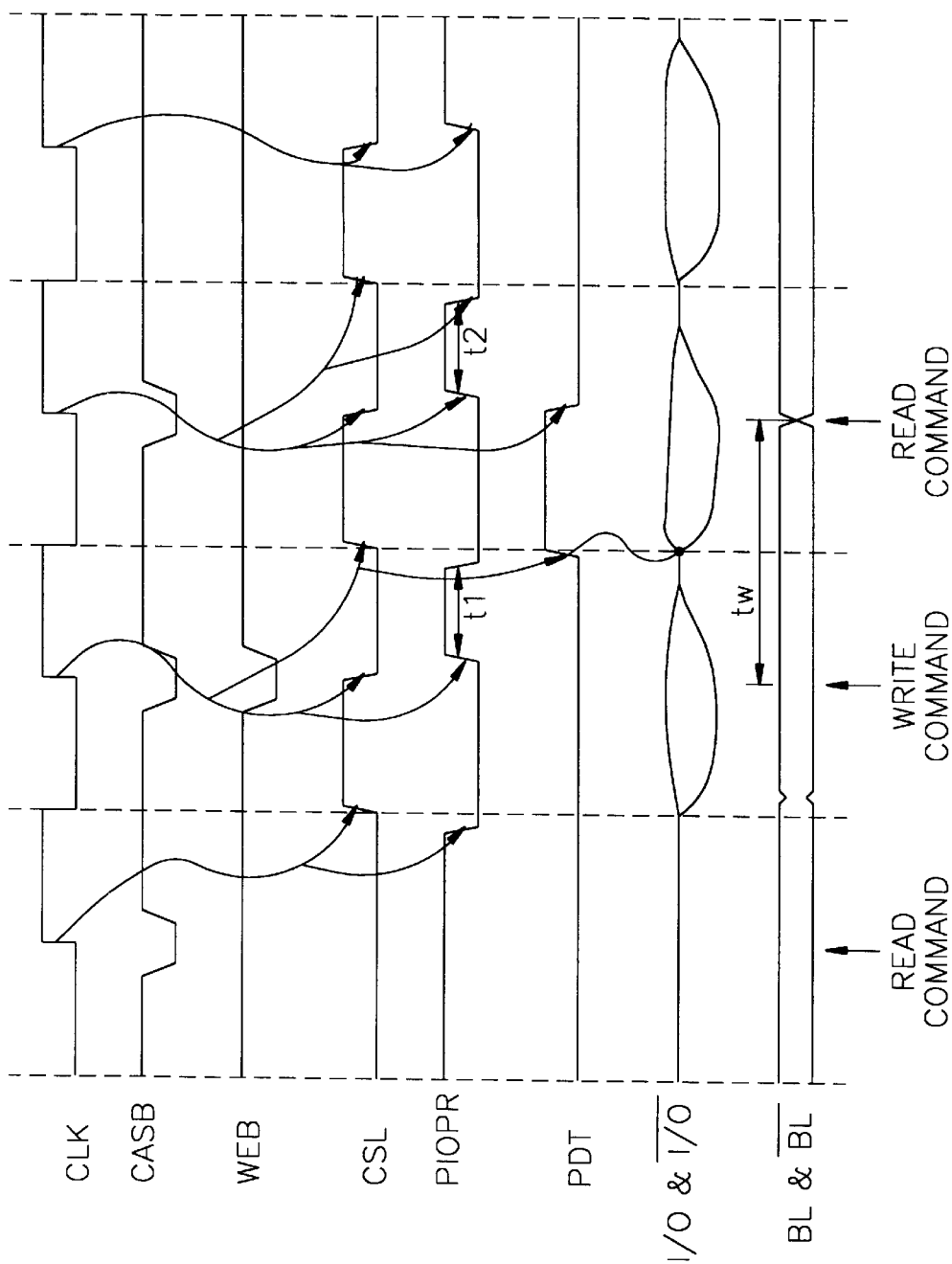
FIG. 2 is a timing diagram which illustrates operation of the memory device of FIG. 1.
Figure 5:
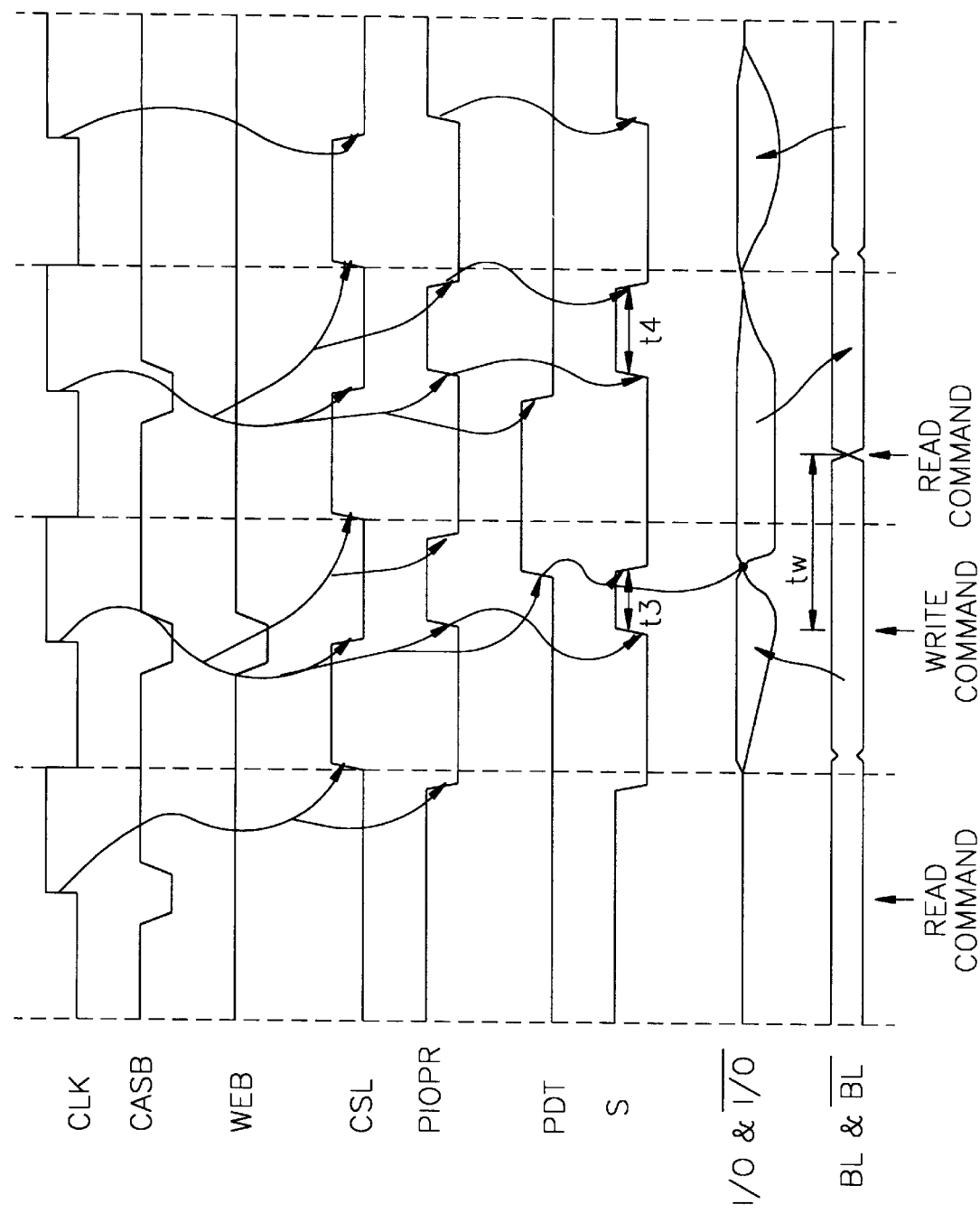
FIG. 5 is a timing diagram which illustrates operation of the integrated circuit memory device of FIG. 3 according to another aspect of the present invention.

Referring now to FIG. 5, the timing of a clock signal CLK, a column address strobe signal (CASB), a write enable signal (WEB) and a column select signal (CSL) are illustrated. In particular, during a write time interval which is triggered when a write command is issued, that is when the column address strobe signal (CASB) and the write enable signal (WEB) are both at logic 0 potentials when a 0→1 transition of the clock signal CLK takes place, the column select signal CSL is initially maintained at a logic 0 potential so that the pair of complementary bit lines BL and /BL are electrically isolated from the corresponding pair of complementary input/output lines IO and /IO. However, the precharge control signal POIPR is driven to a logic 1 potential (while the driver signal PDT remains at a logic 0 potential) so that precharge and equalization of the complementary input/output lines IO and /IO at a power supply potential (e.g., Vdd) (or intermediate potential (e.g., Vdd/2)) can take place while the precharge timing signal S is enabled at a logic 1 potential. Moreover, according to a preferred aspect of the present invention, the duration of a write cycle operation (illustrated as tw) can be reduced by transitioning the driver signal PDT from 0→1 before the precharge control signal PIOPR is disabled. This causes the equalization circuit 401 to become disabled and the driver circuit 403 to become enabled. Data from the complementary data lines DATA and /DATA can then be passed to the input/output lines IO and /IO before any additional capacitive loading caused by turning on the column select circuit 305 takes place. Therefore, in contrast to the timing diagram of FIG. 2 which illustrates operation of a conventional circuit, the timing diagram of FIG. 5 illustrates how the driver signal PDT can be preferably enabled prior to the column select signal CSL, so that the input/output lines IO and /IO can be driven with data before the complementary bit lines BL and /BL receive that data when the column select signal CSL line is enabled. The time (as measured by "tw") at which valid data first becomes available on the complementary bit lines BL and /BL after issuing the write command can therefore be reduced. This improved aspect of the present invention does, however, results in a decrease in the equalization time interval during a write cycle precharge operation (as measured by time interval t3), relative to a read cycle precharge operation (as measured by time interval t4).

Thus, according to the present invention, the precharge time interval during a write operation commences when the driver signal (PDT) and the precharge control signal (PIOPR) are in disabled and enabled states, respectively, at the same time. The precharge time interval also terminates early (relative to a read operation) upon transition of the driver signal (PDT) from its disabled state to an enabled state, even if the precharge control signal remains in its enabled state. Accordingly, a preferred method of operating an integrated circuit memory device includes the steps of (i) generating an enabled column select signal and an enabled precharge control signal during respective nonoverlapping time intervals, (ii) driving a pair of complementary input/output lines with write data in response to a driver signal which is enabled during a portion of a write time interval when the precharge control signal is also enabled, and (iii) precharging the complementary input/output lines during another portion of the write time interval when the precharge control signal is enabled and the driver signal is disabled.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:

a pair of complementary input/output lines;

a pair of complementary data lines;

means, responsive to a driver signal, for driving said pair of complementary input/output lines with complementary data from said pair of complementary data lines when the driver signal is in an enabled state; and means, responsive to both a precharge control signal and the driver signal, for precharging said pair of complementary input/output lines during a precharge time interval, said precharge time interval commencing when the driver signal and the precharge control signal are in disabled and enabled states, respectively, at the same time, and terminating upon transition of the driver signal from its disabled state to an enabled state even if the precharge control signal remains in its enabled state.

2. The memory device of claim 1, wherein said precharging means comprises:

an equalization circuit electrically coupled to said pair of complementary input/output lines and responsive to a pair of complementary precharge timing signals; and a precharge timing circuit which generates the pair of complementary precharge timing signals in response to the precharge control signal and the driver signal.

3. The memory device of claim 2, wherein said equalization circuit comprises first and second field effect transistors electrically coupled in series between said pair of complementary input/output lines.

4. The memory device of claim 2, wherein said equalization circuit comprises:

first and second NMOS transistors electrically coupled in series between said pair of complementary input/output lines; and a PMOS transistor electrically coupled across said pair of complementary input/output lines.

5. The memory device of claim 4, wherein said first and second NMOS transistors are responsive to a first one of the pair of complementary precharge timing signals; and wherein said PMOS transistor is responsive to a second one of the pair of complementary precharge timing signals.

6. The memory device of claim 5, wherein said precharge timing circuit comprises:

a NOR gate having a first input responsive to the driver signal and a second input responsive to an inverted version of the precharge control signal; and an inverter having an input electrically connected to an output of said NOR gate.

7. The memory device of claim 6, wherein the output of said NOR gate is electrically connected to gate electrodes of said first and second NMOS transistors; and wherein an output of said inverter is electrically connected to a gate electrode of said PMOS transistor.

8. The memory device of claim 7, wherein said driving means comprises:

a first buffer having first and second inputs, and an output electrically connected to a first one of said pair of complementary input/output lines;

a first NOR circuit having a first input responsive to a data signal, a second input responsive to an inverted version of the driver signal and an output electrically connected to the first input of said first buffer;

a first OR circuit having a first input responsive to a complementary data signal, a second input responsive to the inverted version of the driver signal and an output electrically connected to the second input of said first buffer;

a second buffer having first and second inputs, and an output electrically connected to a second one of said pair of complementary input/output lines;

a second NOR circuit having a first input responsive to the complementary data signal, a second input responsive to the inverted version of the driver signal and an output electrically connected to the first input of said second buffer; and a second OR circuit having a first input responsive to the data signal, a second input responsive to the inverted version of the driver signal and an output electrically connected to the second input of said second buffer.

9. The memory device of claim 1, wherein said driving means comprises:

a first buffer having first and second inputs, and an output electrically connected to a first one of said pair of complementary input/output lines;

a first NOR circuit having a first input responsive to a data signal, a second input responsive to an inverted version of the driver signal and an output electrically connected to the first input of said first buffer;

a first OR circuit having a first input responsive to a complementary data signal, a second input responsive to the inverted version of the driver signal and an output electrically connected to the second input of said first buffer;

a second buffer having first and second inputs, and an output electrically connected to a second one of said pair of complementary input/output lines;

a second NOR circuit having a first input responsive to the complementary data signal, a second input responsive to the inverted version of the driver signal and an output electrically connected to the first input of said second buffer; and a second OR circuit having a first input responsive to the data signal, a second input responsive to the inverted version of the driver signal and an output electrically connected to the second input of said second buffer.

10. An integrated circuit memory device, comprising:

a pair of complementary input/output lines;

a pair of complementary data lines;

a driver circuit, responsive to a driver signal, to drive said pair of complementary input/output lines with complementary data from said pair of complementary data lines when the driver signal is in an enabled state; and a precharge circuit, responsive to a precharge control signal and the driver signal, to precharge said pair of complementary input/output lines during a precharge time interval, said precharge time interval commencing when the driver signal and the precharge control signal are in disabled and enabled states, respectively, at the same time, and terminating upon transition of the driver signal from its disabled state to an enabled state even if the precharge control signal remains in its enabled state.

11. The memory device of claim 10, wherein said precharge circuit:

an equalization circuit electrically coupled to said pair of complementary input/output lines and responsive to a pair of complementary precharge timing signals; and a precharge timing circuit which generates the pair of complementary precharge timing signals in response to the precharge control signal and the driver signal.

12. The memory device of claim 11, wherein said equalization circuit comprises first and second field effect transistors electrically coupled in series between said pair of complementary input/output lines.

13. The memory device of claim 11, wherein said equalization circuit comprises:
- first and second NMOS transistors electrically coupled in series between said pair of complementary input/output lines; and
- a PMOS transistor electrically coupled across said pair of complementary input/output lines.

14. The memory device of claim 13, wherein said first and second NMOS transistors are responsive to a first one of the pair of complementary precharge timing signals; and wherein said PMOS transistor is responsive to a second one of the pair of complementary precharge timing signals.

15. The memory device of claim 14, wherein said precharge timing circuit comprises:
- a NOR gate having a first input responsive to the driver signal and a second input responsive to an inverted version of the precharge control signal; and
- an inverter having an input electrically connected to an output of said NOR gate.

16. The memory device of claim 15, wherein the output of said NOR gate is electrically connected to gate electrodes of said first and second NMOS transistors; and wherein an output of said inverter is electrically connected to a gate electrode of said PMOS transistor.

17. The memory device of claim 16, wherein said driver circuit comprises:
- a first buffer having first and second inputs, and an output electrically connected to a first one of said pair of complementary input/output lines;
- a first NOR circuit having a first input responsive to a data signal, a second input responsive to an inverted version of the driver signal and an output electrically connected to the first input of said first buffer;
- a first OR circuit having a first input responsive to a complementary data signal, a second input responsive to the inverted version of the driver signal and an output electrically connected to the second input of said first buffer;
- a second buffer having first and second inputs, and an output electrically connected to a second one of said pair of complementary input/output lines;
- a second NOR circuit having a first input responsive to the complementary data signal, a second input responsive to the inverted version of the driver signal and an output electrically connected to the first input of said second buffer; and
- a second OR circuit having a first input responsive to the data signal, a second input responsive to the inverted version of the driver signal and an output electrically connected to the second input of said second buffer.

18. The memory device of claim 10, wherein said driver circuit comprises:
- a first buffer having first and second inputs, and an output electrically connected to a first one of said pair of complementary input/output lines;
- a first NOR circuit having a first input responsive to a data signal, a second input responsive to an inverted version of the driver signal and an output electrically connected to the first input of said first buffer;
- a first OR circuit having a first input responsive to a complementary data signal, a second input responsive to the inverted version of the driver signal and an output electrically connected to the second input of said first buffer;
- a second buffer having first and second inputs, and an output electrically connected to a second one of said pair of complementary input/output lines;
- a second NOR circuit having a first input responsive to the complementary data signal, a second input responsive to the inverted version of the driver signal and an output electrically connected to the first input of said second buffer; and
- a second OR circuit having a first input responsive to the data signal, a second input responsive to the inverted version of the driver signal and an output electrically connected to the second input of said second buffer.

19. A method of operating an integrated circuit memory device, comprising the steps of:
- generating an enabled column select signal and an enabled precharge control signal during respective non-overlapping time intervals;
- driving a pair of complementary input/output lines with write data, in response to a driver signal which is enabled during a portion of a write time interval when the precharge control signal is also enabled; and
- precharging the complementary input/output lines during another portion of the write time interval when the precharge control signal is enabled and the driver signal is disabled.

* * * * *